(12) United States Patent
Kim et al.

(10) Patent No.: US 11,430,952 B2
(45) Date of Patent: Aug. 30, 2022

(54) ELECTRONIC DEVICE AND METHOD FOR MANUFACTURING ELECTRONIC DEVICE

(71) Applicant: SK hynix Inc., Icheon (KR)

(72) Inventors: Myoung Sub Kim, Icheon (KR); Tae Hoon Kim, Icheon (KR); Beom Seok Lee, Icheon (KR); Seung Yun Lee, Icheon (KR); Hwan Jun Zang, Icheon (KR); Byung Jick Cho, Icheon (KR); Ji Sun Han, Icheon (KR)

(73) Assignee: SK hynix Inc., Icheon (KR)

( * ) Notice: Subject to any disclaimer, the term of this patent is extended or adjusted under 35 U.S.C. 154(b) by 125 days.

(21) Appl. No.: 16/984,688

(22) Filed: Aug. 4, 2020

(65) Prior Publication Data

US 2021/0280781 A1 Sep. 9, 2021

(30) Foreign Application Priority Data

Mar. 4, 2020 (KR) ........................ 10-2020-0027405

(51) Int. Cl.
*H01L 45/00* (2006.01)
*H01L 27/24* (2006.01)
*H01L 27/22* (2006.01)
*H01L 43/02* (2006.01)
*H01L 43/12* (2006.01)

(52) U.S. Cl.
CPC ........ *H01L 45/1253* (2013.01); *H01L 27/222* (2013.01); *H01L 27/2481* (2013.01); *H01L 43/02* (2013.01); *H01L 43/12* (2013.01); *H01L 45/06* (2013.01); *H01L 45/16* (2013.01)

(58) Field of Classification Search
None
See application file for complete search history.

(56) References Cited

U.S. PATENT DOCUMENTS

| 5,935,639 | A | 8/1999 | Sullivan et al. |
| 10,825,987 | B2 * | 11/2020 | Zheng .................... H01L 45/04 |
| 2010/0221896 | A1 | 9/2010 | Sandoval |

FOREIGN PATENT DOCUMENTS

KR 10-1582317 B1 1/2016

OTHER PUBLICATIONS

S. Sattel et al., "Effects of deposition temperature on the properties of hydrogenated tetrahedral amorphous carbon", J. Appl. Phys. 82, Aug. 17, 1998, 12 pages.
B. Kleinsorge et al., "Influence of nitrogen and temperature on the deposition of tetrahedrally bonded amorphous carbon", J. Appl. Phys. 88, Jun. 28, 2000, 10 pages.
X.L. Peng et al., "Surface roughness of diamond-like carbon films prepared using various techniques", Surface and Coatings Technology 138, 2001, pp. 23-32.

(Continued)

*Primary Examiner* — Mounir S Amer

(57) ABSTRACT

A method for manufacturing an electronic device including a semiconductor memory may include forming a first carbon electrode material, surface-treating the first carbon electrode material to decrease a surface roughness of the first carbon electrode material, and forming a second carbon electrode material on the treated surface of the first carbon electrode material. The second carbon electrode material may have a thickness that is greater than a thickness of the first carbon electrode material.

16 Claims, 16 Drawing Sheets

(56) References Cited

OTHER PUBLICATIONS

S. Sattel et al., "Temperature dependence of the formation of highly tetrahedral a-C : H", Diamond and Related Materials 5, 1996, pp. 425-428.
J. Robertson, "Diamond-like amorphous carbon", Materials Science and Engineering, 2002, pp. 129-281.

* cited by examiner

ELECTRONIC DEVICE AND METHOD FOR MANUFACTURING ELECTRONIC DEVICE

CROSS-REFERENCE TO RELATED APPLICATION

The present application claims priority under 35 U.S.C. § 119(a) to Korean patent application number 10-2020-0027405, filed on Mar. 4, 2020, in the Korean Intellectual Property Office, the entire disclosure of which is incorporated herein by reference.

BACKGROUND

Field of Invention

The present disclosure generally relates to an electronic device, and more particularly, to an electronic device including a semiconductor memory and a method for manufacturing an electronic device.

Description of Related Art

Recently, as electronic devices and appliances trend toward miniaturization, low power consumption, high performance, multi-functionality, and the like, there has been a demand for semiconductor devices capable of storing information in various electronic devices and appliances such as a computer and a portable communication device. Thus, research has been conducted for semiconductor devices capable of storing data using a characteristic that the semiconductor devices are switched between different resistant states according to a voltage or current applied thereto. Examples of the semiconductor devices are a resistive random access memory (RRAM), a phase change random access memory (PRAM), a ferroelectric random access memory (FRAM), a magnetic random access memory (MRAM), an E-fuse, and the like.

SUMMARY

Embodiments provide an electronic device capable of improving the operational characteristics and reliability of a memory cell, and a method for manufacturing an electronic device.

In accordance with an aspect of the present disclosure, a method for manufacturing an electronic device including a semiconductor memory includes forming a first carbon electrode material, surface-treating the first carbon electrode material to decrease a surface roughness of the first carbon electrode material, and forming a second carbon electrode material on a surface of the surface-treated first carbon electrode material, wherein the second carbon electrode material has a thickness that is less than a thickness of the first carbon electrode material.

In accordance with another aspect of the present disclosure, a method for manufacturing an electronic device with a semiconductor memory includes forming a first carbon electrode material under a first process condition and forming a second carbon electrode material on a surface of the first carbon electrode material under a second process condition different from the first process condition, wherein the second carbon electrode material has a thickness that is less than a thickness of the first carbon electrode material.

In accordance with still another aspect of the present disclosure, a semiconductor memory of an electronic device includes a row line, a column line intersecting the row line, and a memory cell located between the row line and the column line, the memory cell including a first carbon electrode material and a second carbon electrode material which is formed on a surface of the first carbon electrode material and has a thickness of 100 Å or less.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural and functional descriptions disclosed herein is merely illustrative for the purpose of describing embodiments of the present disclosure. The embodiments according to the concept of the present disclosure can be implemented in various forms, and cannot be construed as limited to the embodiments set forth herein.

Figure 1:
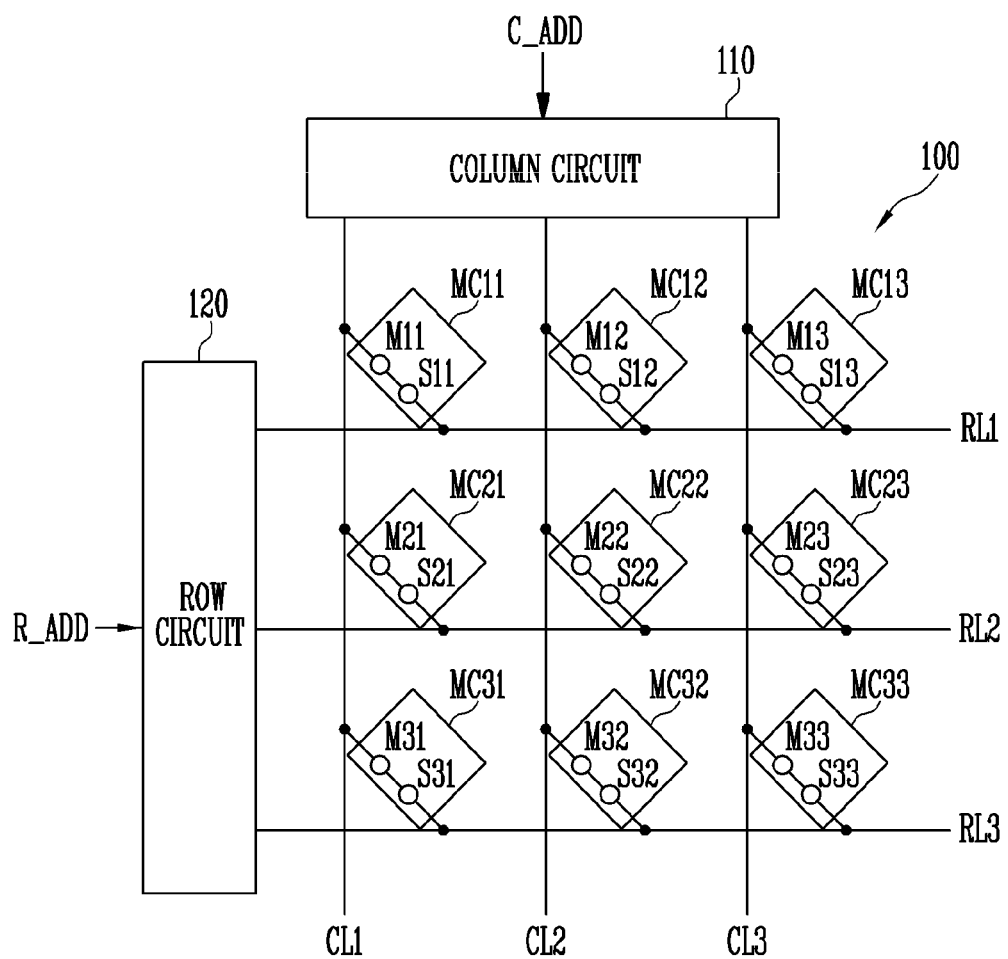
FIG. 1 is a view illustrating a structure of an electronic device in accordance with an embodiment of the present disclosure, which is a circuit diagram of a cell array.

FIG. 1 is a view illustrating a structure of an electronic device in accordance with an embodiment of the present disclosure, and shows a circuit diagram of a cell array.

Referring to FIG. 1, an embodiment of an electronic device may include a semiconductor memory. The semiconductor memory may be a nonvolatile memory device, and may be a variable resistance memory device. The semiconductor memory may include row lines RL and column lines CL intersecting the row lines RL. The row lines RL may be word lines, and the column lines CL may be bit lines. Word lines and the bit lines are relative, and in another embodiment the row lines RL may be bit lines and the column lines CL may be word lines.

The cell array 100 may include memory cells MC11 to MC33 respectively disposed between column lines CL1 to CL3 and row lines RL1 to RL3. The memory cells MC11 to MC33 may be disposed at intersection points of the column lines CL1 to CL3 and the row lines RL1 to RL3. Each of the memory cells MC11 to MC33 may include at least one of the selection elements S11 to S33 and memory elements M11 to M33. For example, each of the memory cells MC11 to MC33 may include a corresponding selection element from among the selection elements S11 to S33 and a corresponding memory element from among the memory elements M11 to M33, which are connected to one another in series. The selection elements S11 to S33 may be electrically connected to the row lines RL1 to RL3, and the memory elements M11 to M33 may be electrically connected to the column lines CL1 to CL3.

Each of the memory elements M11 to M33 is a storage node for storing data, and may include a variable resistance material. The variable resistance material may be a resistive material, a Magnetic Tunnel Junction (MTJ), a phase change material, or the like. Each of the selection elements S11 to S33 is used to select a memory cell MC, and may include a switching material. Each of the selection elements S11 to S33 may be a diode, a PNP diode, a Bipolar Junction Transistor (BJT), a Metal Insulator Transition (MIT) element, a Mixed Ionic-Electronic Conduction (MIEC) element, an Ovonic Threshold Switching (OTS) element, or the like.

The shape and configuration of each of the memory cells MC11 to MC33 may vary between embodiments. For example, in some embodiments the selection elements S11 to S33 may be omitted, or the memory elements M11 to M33 may be omitted. Alternatively, the positions of the selection elements S11 to S33 and the memory elements M11 to M33 may be reversed. The selection elements S11 to S33 may be electrically connected to the column lines CL1 to CL3, and the memory elements M11 to M33 may be electrically connected to the row lines RL1 to RL3.

In addition, the semiconductor memory may further include a column circuit 110 for controlling the column lines CL1 to CL3 and a row circuit 120 for controlling the row lines RL1 to RL3.

The row circuit 120 may be a row decoder, a word line decoder, a word line driver, or the like. The row circuit 120 may select a row line according to a row address R_ADD. The column circuit 110 may be a column decoder, a bit line decoder, a bit line driver, or the like. The column circuit 110 may select a column line according to a column address C_ADD. In an example, when the row circuit 120 selects the row line RL2 and the column circuit 110 selects the column line CL2, a memory cell MC22 connected between the selected column line CL2 and the selected row line RL2 may be selected.

Although three column lines CL1 to CL3 and three row lines RL1 to RL3 are illustrated in FIG. 1, this is merely for convenience of description, and the present disclosure is not limited to a particular number of row lines or column lines. The numbers of the column lines CL1 to CL3 and the row lines RL1 to RL3, which are included in the cell array 100, may be changed, if necessary.

Figure 2A:
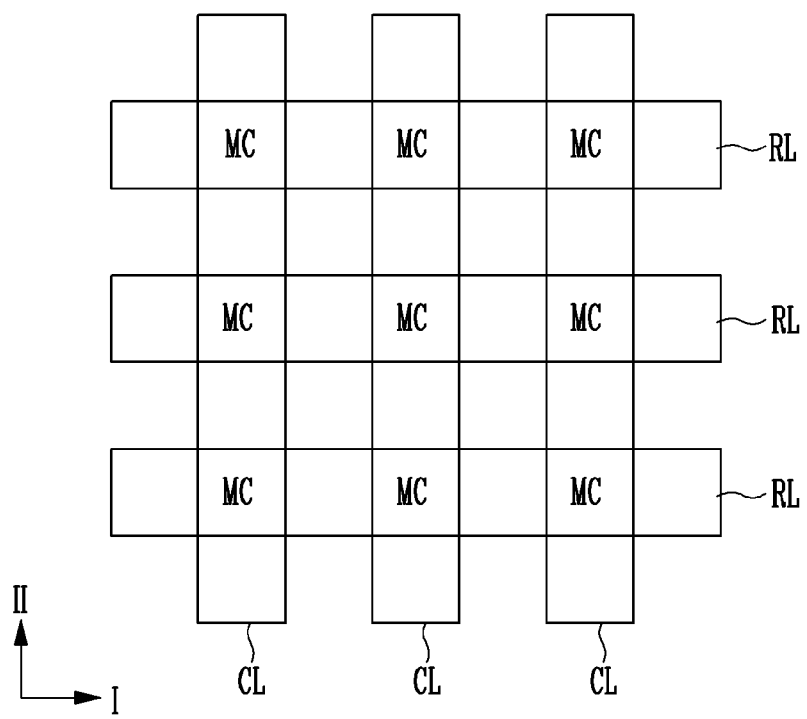
FIGS. 2A, 2B and 2C are views illustrating a structure of an electronic device in accordance with an embodiment of the present disclosure.
Figure 2B:
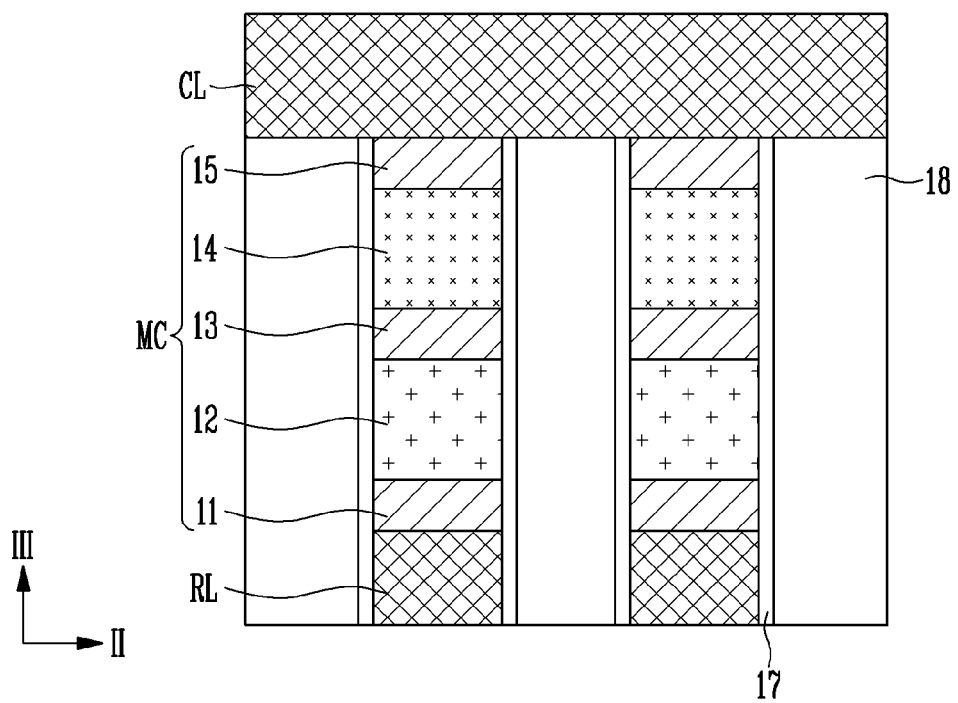
Figure 2C:
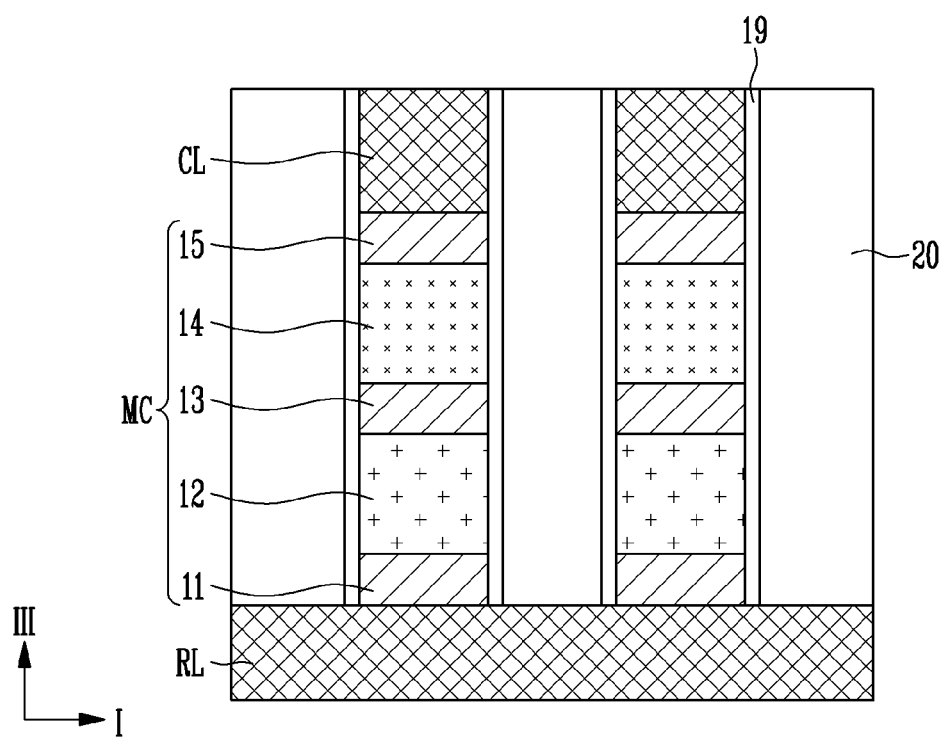

FIGS. 2A to 2C are views illustrating a structure of an electronic device in accordance with an embodiment of the present disclosure. FIG. 2A is a layout view, FIG. 2B is a cross-sectional view from the perspective of second direction II shown in FIG. 2A, and FIG. 2C is a cross-sectional view from the perspective of first direction I shown in FIG. 2A. In the following description, elements that are redundant to the disclosure above may be omitted for the sake of brevity.

Referring to FIGS. 2A to 2C, an electronic device in accordance with an embodiment of the present disclosure may include a semiconductor memory, and the semiconductor memory may include row lines RL, column lines CL, and memory cells MC. Protective layers 17 and 19 may be formed on sidewalls of the memory cell MC. Insulating layers 18 and 20 may be formed between adjacent memory cells MC, between adjacent row lines RL, and between adjacent column lines CL.

The row lines RL may extend in the first direction I. The column lines CL may extend in the second direction II intersecting the first direction I. The row lines RL and the column lines CL may be located at different levels in a third direction III. The third direction III may intersect the first direction I and the second direction II. For example, the third direction III may be orthogonal to a plane defined by the first direction I and the second direction II.

Each of the memory cells MC may include a first electrode 11, a switching layer 12, a second electrode 13, a variable resistance layer 14, and a third electrode 15. The first electrode 11, the switching layer 12, the second electrode 13, the variable resistance layer 14, and the third electrode 15 may be stacked in the third direction III.

The variable resistance layer 14 may include a resistive material. The variable resistance layer 14 may include a transition metal oxide or include a metal oxide such as a perovskite-based material. Thus, an electrical path may be generated or removed in the variable resistance layer 14, so that data can be stored.

The variable resistance layer may have an MTJ structure. The variable resistance layer 14 may include a magnetization fixed layer, a magnetization free layer, and a tunnel barrier layer interposed therebetween. The magnetization fixed layer and the magnetization free layer may include a magnetic material. The tunnel barrier layer may include oxide of a metal such as magnesium (Mg), aluminum (Al), zinc (Zn), or titanium (Ti). The magnetization direction of the magnetization free layer may be changed by spin torque of electrons in an applied current. Therefore, data may be stored according to a change in the magnetization direction of the magnetization free layer with respect to the magnetization direction of the magnetization fixed layer.

The variable resistance layer 14 may include a phase change material, and include chalcogenide-based material. The variable resistance layer 14 may include chalcogenide glass, a chalcogenide alloy, etc. The variable resistance layer 14 may include one or more of silicon (Si), germanium (Ge), antimony (Sb), tellurium (Te), bismuth (Bi), indium (In), tin (Sn), selenium (Se), carbon (C), nitrogen (N), oxygen (O), etc. For example, the variable resistance layer 14 may be a Ge—Sb—Te(GST) material such as $Ge_2Sb_2Te_5$, $Ge_2Sb_2Te_7$, $Ge_1Sb_2Te_4$, $Ge_1Sb_4Te_7$ or the like. A phase of the variable resistance layer 14 may be changed depending on a program operation. The variable resistance layer 14 may have a low-resistance crystalline state due to a set operation, and the variable resistance layer 14 may have a high-resistance crystalline state due to a reset operation. Therefore, data may be stored in the memory cell MC by using different resistances related to a phase of the variable resistance layer 14.

In another embodiment, the variable resistance layer 14 may include a variable resistance material of which resistance is changed without any phase change, and include a chalcogenide-based material. The variable resistance 14 may include one or more of germanium (Ge), antimony (Sb), tellurium (Te), arsenic (As), selenium (Se), silicon (Si), indium (In), tin (Sn), sulfur (S), gallium (Ga), carbon (C), nitrogen (N), oxygen (O), etc. The variable resistance layer 14 may have a single phase, and the phase of variable resistance layer 14 may be maintained in a program operation. For example, when the variable resistance layer 14 has an amorphous state, and the state of the variable resistance layer 14 may not change to a crystalline state in the program operation. Rather, the threshold voltage of the memory cell MC may be changed by a program pulse applied to the memory cell MC, and the memory cell MC may be programmed to have at least two states. The variable resistance layer 14 may have a high-resistance state due to a reset operation, and the memory cell MC may be programmed to a reset state having a high threshold voltage. The variable resistance layer 14 may have a low-resistance state due to a set operation, and the memory cell MC may be programmed to a set state having a low threshold voltage. In an embodiment, the variable resistance layer 14 has an amorphous phase in both of the high and low threshold voltage states.

The switching layer 12 may be a selection element which controls the flow of current according to the magnitude of a voltage or current applied thereto. When the magnitude of the applied voltage and current is the same or less than a threshold value, only a relatively small amount of flows in the switching layer 12. When the magnitude of the applied voltage and current exceeds the threshold value, a rapidly increased current flows in the switching layer 12.

When the switching layer 12 is a Metal Insulator Transition (MIT) element, the switching layer 12 may include $VO_2$, $NbO_2$, $TiO_2$, $WO_2$, $TiO_2$, etc. When the switching layer 12 is a Mixed Ion-Electron Conducting (MIEC) element, the switching layer 12 may include $ZrO_2(Y_2O_3)$, $Bi_2O_3$—BaO, $(La_2O_3)_x(CeO_2)_{1-x}$, etc. Also, when the switching layer 12 is an Ovonic Threshold Switching (OTS) element, the switching layer 12 may include Te, Se, Ge, Si, As, Ti, S, Sb, C, N, O, etc. For example, the switching layer 12 may include a chalcogenide-based material such as AsTe, AsSe, AsTeSe, AsTeGe, AsSeGe or AsTeGeSe.

The first electrode 11 may be electrically connected to the row line RL. The second electrode 13 may be interposed between the switching layer 12 and the variable resistance layer 14. The third electrode 15 may be electrically connected to the column line CL. Each of the first to third electrodes 11, 13, and 15 may have a single layer or a plurality of layers. An interface between the layers may be surface-treated to reduce surface roughness. In addition, at least one of the first to third electrodes 11, 13, and 15 may have a surface roughness of 30 Å or less.

An electrode material included in the first electrode 11, the second electrode 13, and the third electrode 15 may be determined in consideration of one or more factor such as preventing diffusion, chemical reactivity, contact resistance, bulk resistance, surface roughness, etc. The electrode material may be a material which prevents or minimizes material movement between peripheral layers, e.g., material movement between the variable resistance layer 14 and the switching layer 12. The electrode material may be a material having a low chemical reactivity with peripheral layers, e.g., the variable resistance layer 14 or the switching layer 12. The electrode material may be a material which forms an ohmic contact with peripheral layers, e.g., the variable resistance layer 14 or the switching layer 12. Also, the electrode material may be a material which has a high density, a low resistivity, and a low roughness.

The electrode material may include a conductive material such as metal or metal oxide. Each of the first electrode 11, the second electrode 13, and the third electrode 15 may include one or more of tungsten (W), tungsten nitride (WN), tungsten silicide (WSi), titanium (Ti), titanium nitride ($TiN_x$), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), carbon nitride ($CN_x$) silicon carbide (SiC), silicon carbon nitride (SiCN), copper (Cu), zinc (Zn), nickel (Ni), cobalt (Co), lead (Pb), platinum (Pt), etc.

According to the structure described above, the first electrode 11, the switching layer 12, and the second electrode 13 may constitute a selection element. The second electrode 13, the variable resistance layer 14, and the third electrode 15 can constitute a memory element. In addition, the selection element and the memory device may share the second electrode 13. In an embodiment, data storage is provided by a selection element, and a separate memory layer is not present. The selection element may store data while serving as a switch.

Figure 3:
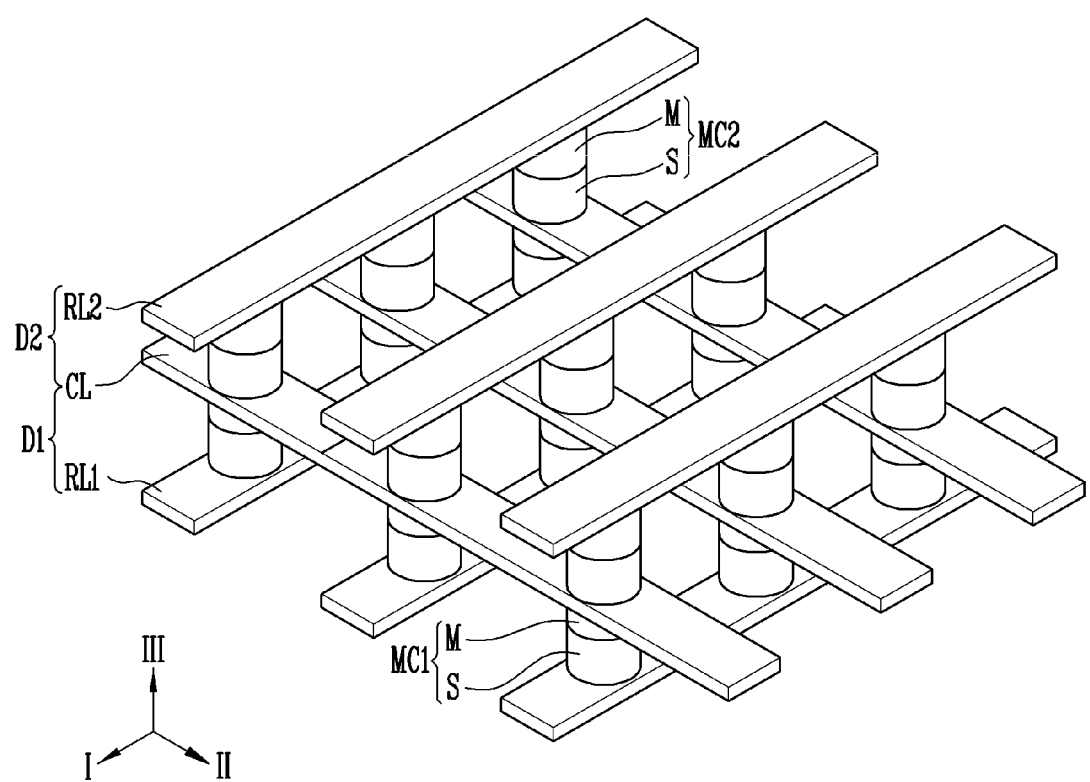
FIG. 3 is a perspective view illustrating a structure of an electronic device in accordance with an embodiment of the present disclosure.

FIG. 3 is a perspective view illustrating a structure of an electronic device in accordance with an embodiment of the present disclosure. Hereinafter, descriptions that are redundant to the description above may be omitted.

Referring to FIG. 3, a semiconductor device in accordance with an embodiment of the present disclosure may include a three-dimensionally arranged memory cell array. The memory cell array may include stacked memory cells MC1 and MC2, and have a multi-deck structure. According to the multi-deck structure, multiple layers of column lines CL and row lines RL1 and RL2 may be arranged in the same structure.

First row lines RL1 and second row lines RL2 may extend in parallel in a first direction I. The column lines CL may extend in parallel in a second direction II. The first row lines RL1, the column lines CL, and the second row lines RL2 may be located at different levels in a third direction III. The column lines CL may be located above the first row lines RL1, and the second row lines RL2 may be located above the column line CL.

First memory cells MC1 may be located between the column lines CL and the first row lines RL1. Each of the first memory cells MC1 may include at least one of a selection element S and a memory element M. Second memory cells MC2 may be located between the column lines CL and the second row lines RL2. Each of the second memory cells MC2 may include at least one of a selection element S and a memory element M.

According to the structure described above, the first row lines RL1, the column lines CL, and the first memory cells MC1 may constitute a first deck D1. In addition, the second row lines RL2, the column lines CL, and the second memory cells MC2 may constitute a second deck D2. The first deck D1 and the second deck D2 may be stacked in the third direction III, and share the column lines CL so that each of the column lines CL interface with two different decks. Each of the column lines CL may have a single layer or a plurality of layers.

Figure 4A:
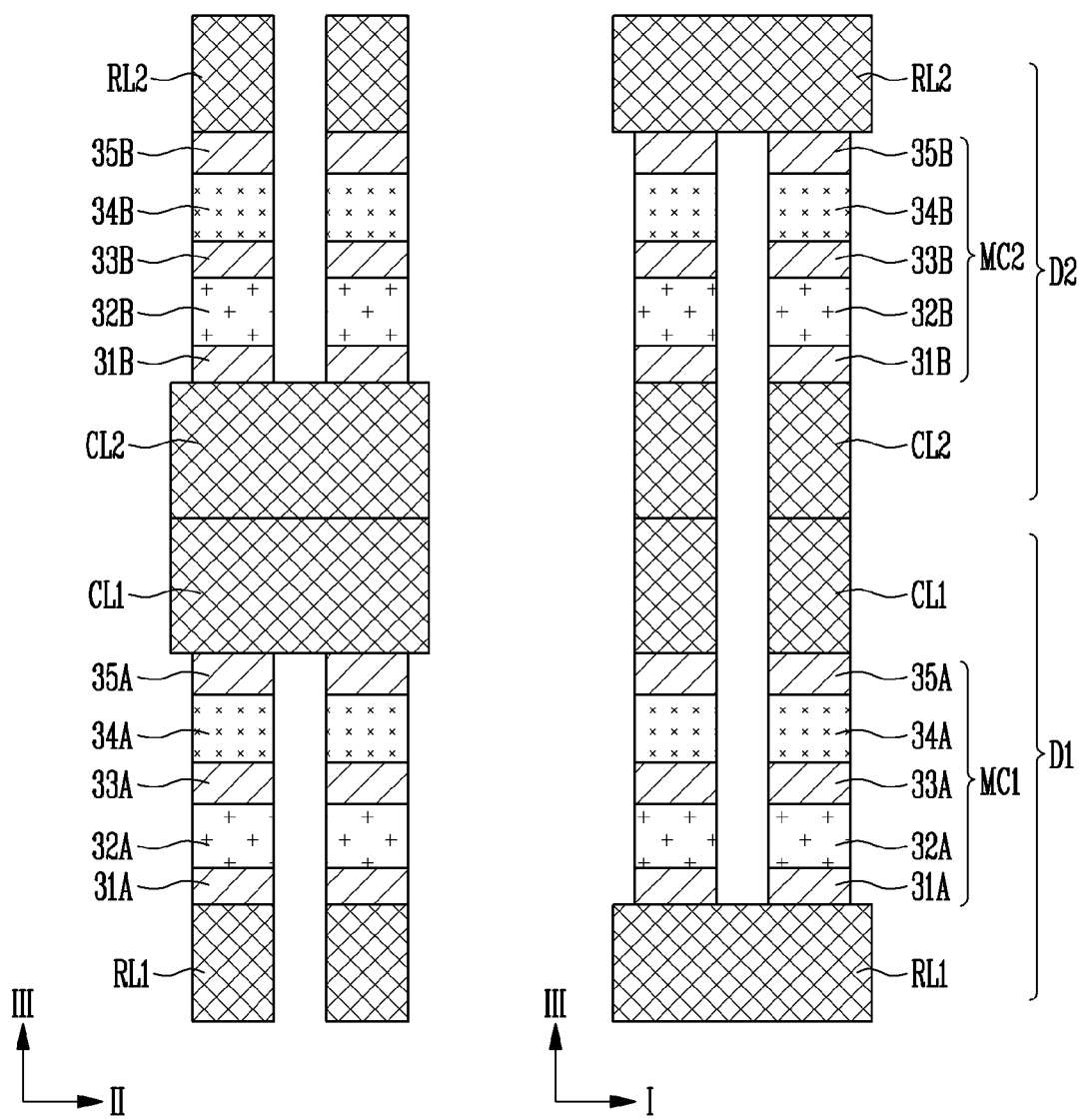
FIGS. 4A and 4B are views illustrating a structure of an electronic device.
Figure 4B:
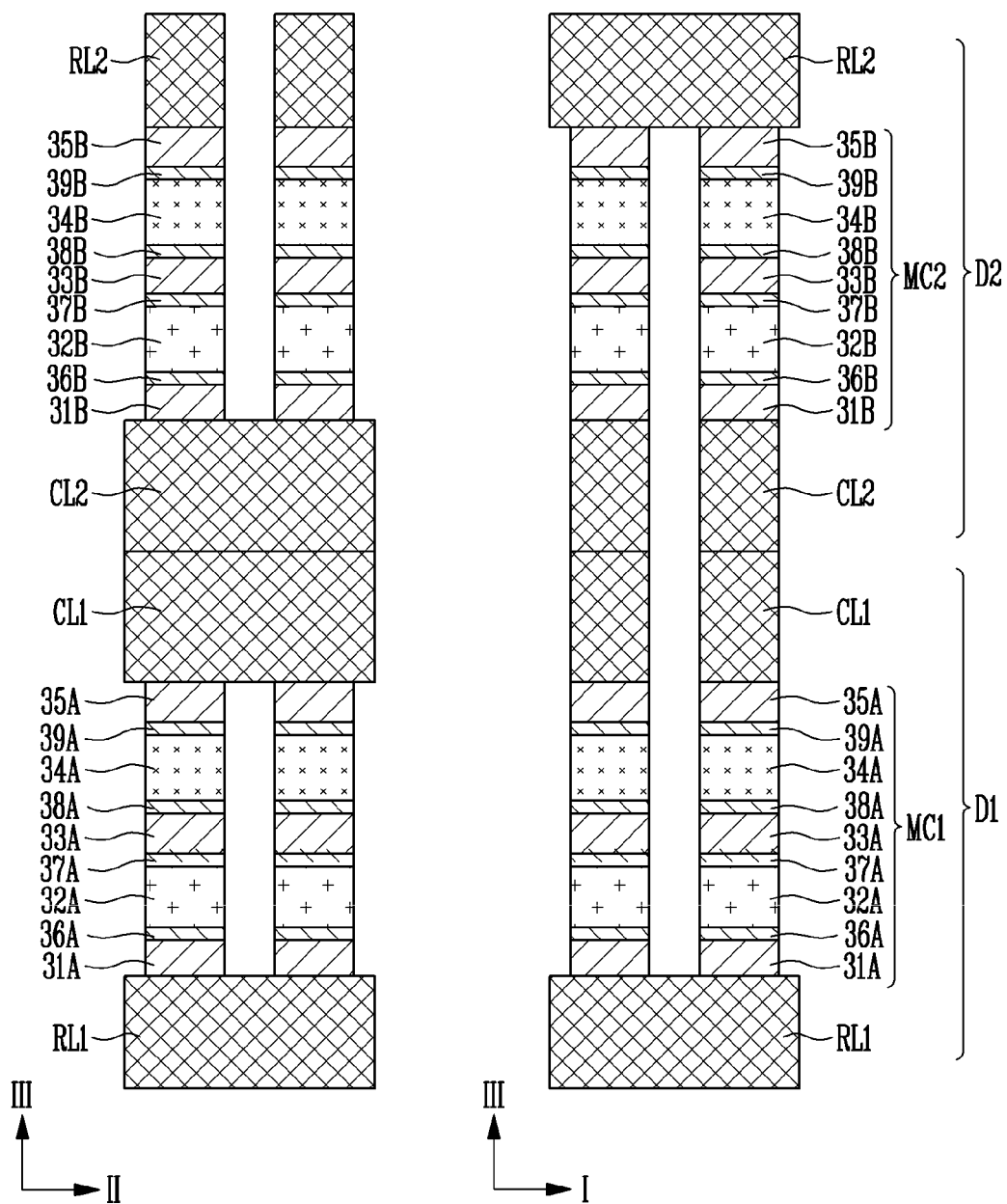

FIGS. 4A and 4B are views illustrating different structures of an electronic device. FIGS. 4A and 4B each show two cross-sectional views of an electronic device from the perspective of a first direction I and a second direction II. In the following description, elements that are redundant to the disclosure above may be omitted.

Referring to FIG. 4A, a first deck D1 may include a first row line RL1, a first memory cell MC1, and a first column line CL1. The first memory cell MC1 may include a first electrode 31A, a switching layer 32A, a second electrode 33A, a variable resistance layer 34A, and a third electrode 35A. A second deck D2 may include a second column line CL2, a second memory cell MC2, and a second row line RL2. The second memory cell MC2 may include a first electrode 31B, a switching layer 32B, a second electrode 33B, a variable resistance layer 34B, and a third electrode 35B. In the embodiments shown in FIG. 4A, the first column line CL1 and the second column line CL2 are electrically connected to each other. In another embodiment, one of the first column line CL1 or the second column line CL2 may be omitted, and the first deck D1 and the second deck D2 may share a column line.

Referring to FIG. 4B, at least one of the first memory cell MC1 and the second memory cell MC2 may further include at least one of interface electrodes 36A to 39A or 36B to 39B. The interface electrode may include a conductive material such as metal or metal nitride. The interface electrode may include one or more of tungsten (W), tungsten nitride (WN), tungsten silicide (WSi), titanium (Ti), titanium nitride (TiN$_x$), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), carbon nitride (CN$_x$) silicon carbide (SiC), silicon carbon nitride (SiCN), copper (Cu), zinc (Zn), nickel (Ni), cobalt (Co), lead (Pb), platinum (Pt), etc.

The first memory cell MC1 may further include at least one of a first interface electrode 36A, a second interface electrode 37A, a third interface electrode 38A, and a fourth interface electrode 39A. The first interface electrode 36A may be interposed between the first electrode 31A and the switching layer 32A, the second interface electrode 37A may be interposed between the switching layer 32A and the second electrode 33A, the third interface electrode 38A may be interposed between the second electrode 33A and the variable resistance layer 34A, and the fourth interface electrode 39A may be interposed between the variable resistance layer 34A and the third electrode 35A.

The second memory cell MC2 may further include at least one of a first interface electrode 36B, a second interface electrode 37B, a third interface electrode 38B, and a fourth interface electrode 39B. The first interface electrode 36B may be interposed between the first electrode 31B and the switching layer 32B, the second interface electrode 37B may be interposed between the switching layer 32B and the second electrode 33B, the third interface electrode 38B may be interposed between the second electrode 33B and the variable resistance layer 34B, and the fourth interface electrode 39B may be interposed between the variable resistance layer 34B and the third electrode 35B.

Figure 5A:
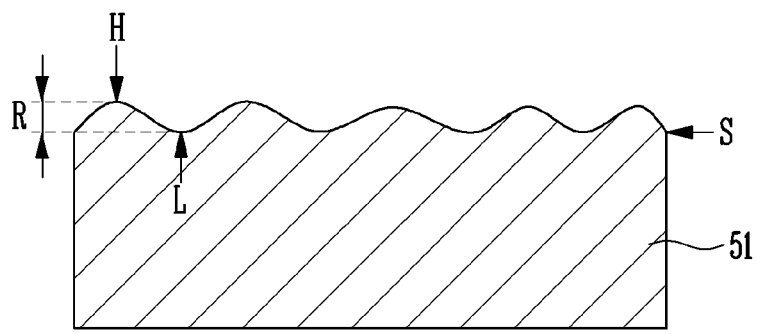
FIGS. 5A, 5B and 5C are cross-sectional views illustrating a method for manufacturing an electronic device in accordance with an embodiment of the present disclosure.
Figure 5B:
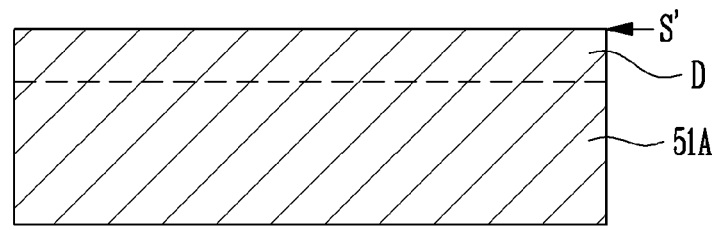
Figure 5C:
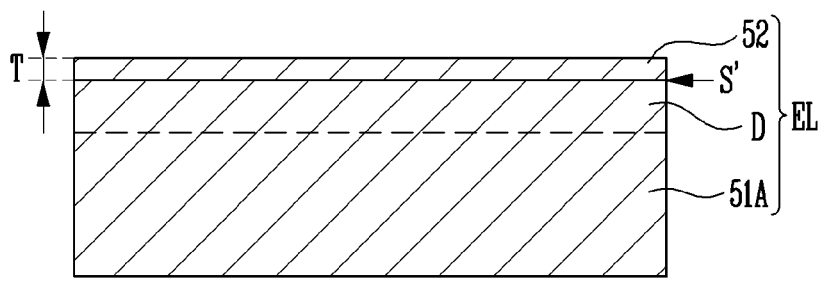

FIGS. 5A to 5C are cross-sectional views illustrating a method for manufacturing an electronic device in accordance with an embodiment of the present disclosure. In the following description, elements that are redundant to the disclosure above may be omitted.

Referring to FIG. 5A, a first electrode material 51 is formed. The first electrode material 51 may be used to form the first electrode 11, the second electrode 13, or the third electrode 15, which are described with reference to FIGS. 2B and 2C. Alternatively, the first electrode material 51 may be used to form the first electrode 31A or 31B, the second electrode 33A or 33B, or the third electrode 35A or 35B, which are described with reference to FIGS. 4A and 4B.

The first electrode material 51 may include a conductive material such as metal or metal nitride. The first electrode material 51 may include one or more of tungsten (W), tungsten nitride (WN), tungsten silicide (WSi), titanium (Ti), titanium nitride (TiN$_x$), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), carbon nitride (CN$_x$) silicon carbide (SiC), silicon carbon nitride (SiCN), copper (Cu), zinc (Zn), nickel (Ni), cobalt (Co), lead (Pb), platinum (Pt), etc. The first electrode material 51 may be formed by using a deposition process such as Physical Vapor Deposition (PVD).

One or more property of the first electrode material 51 may be controlled according to process conditions. For example, properties such as resistance and roughness of the first electrode material 51 may be controlled by adjusting process conditions such as temperature and impurity concentration. The roughness may be expressed by quantifying the variation in height of peaks and valleys present on a surface S of the first electrode material 51. When a height difference R between a high point H and a low point L of the surface S is large, the roughness is high. When the height difference R is small, the roughness is low. In the present disclosure, roughness may be expressed as an $R_a$ value, which is an average roughness value across a predetermined distance. Alternatively, roughness may be an average roughness value for an area, or a difference in height between the highest point and the lowest point on a surface. The roughness may be measured by an atomic force microscope or a scanning electron microscope.

The first electrode material 51 may be used to form an electrode included in a memory cell, and the material and electrode may have a low resistance. The first electrode material 51 may be one of a plurality of layers constituting the memory cell, and have a surface with a low roughness such that the layers are stably adhered to each other. Thus, the first electrode material 51 is formed to have a surface with a low surface roughness and a low resistance, which improve operational characteristics of the memory cell.

However, the resistance and the roughness have a trade-off relationship. For example, when the first electrode material 51 is formed at a low temperature or when the impurity concentration of the first electrode material 51 is increased, the resulting first electrode material 51 has a surface with a low roughness and a high resistance. Conversely, when the first electrode material 51 is formed at a higher temperature or when the impurity concentration of the first electrode material 51 is decreased, the first electrode material 51 has a lower resistance and a higher surface roughness.

A high roughness of the surface S may cause a failure in a manufacturing process. For example, consider an embodiment in which a functional layer (variable resistance layer, switching layer, etc.) is formed on the first electrode material 51. When the roughness of the surface S is high, a fine structure of an initial thin film of the functional layer may be degraded, and a void may be generated at an interface between the first electrode material 51 and the functional layer. The presence of a void at the interface may degrade performance characteristics and reduce the adhesion strength of the functional layer. In addition, a difference between a threshold voltage in a region corresponding to the high point H in the functional layer and a threshold voltage in a region corresponding to the low point L in the functional layer occurs. The threshold voltage in the region corresponding to the low point L may be higher than the threshold voltage in the region corresponding to the high point H. Therefore, the threshold voltage of memory cells may become non-uniform in proportion to a degree of surface roughness.

In an embodiment in which the first electrode material 51 is formed on the functional layer (variable resistance layer, switching layer, etc.), the uneven shape of the surface S of the first electrode material 51 is transferred downward when the first electrode material 51 is etched to form an electrode. Therefore, a region corresponding to the low point L of the electrode in the functional layer may be exposed while the region corresponding to the high point H in the functional layer remains intact, and may be chemically or physically damaged by an etching process. In addition, when low points in a surface are located at edges of a structure, the width of associated electrodes may be non-uniform, and the width of the functional layer (variable resistance layer, switching layer, etc.) on the bottom of the electrodes may also become non-uniform.

Thus, in accordance with embodiments of the present disclosure, a process for reducing the roughness of the surface S of the first electrode material 51 is performed.

Referring to FIG. 5B, the first electrode material 51 is surface-treated. The roughness of a surface S' of the first electrode material 51 may be reduced through a surface treatment process. In an embodiment, the surface treatment process may be performed when the first electrode material 51 is formed. An impurity such as nitrogen may be doped in-situ when the first electrode material 51 is formed. In another embodiment, the surface treatment process may be performed after the first electrode material 51 is formed. After the first electrode material 51 is formed, the surface S' of the first electrode material 51 may be etched, or an impurity may be ion-injected into the first electrode material 51. The impurity may be a material such as boron, nitrogen, etc. The etching process may be an RF plasma etching process, or be performed using hydrogen gas as an etching gas.

Meanwhile, a surface-treated first electrode material 51A may include a damaged region D. The damaged region D may have an unstable coupling state, and have a resistance greater than a resistance of the undamaged region. Therefore, the damaged region D may be covered to stably form a structure such as a variable resistance layer on surface S'.

Referring to FIG. 5C, a second electrode material 52 is formed on the surface S' of the first electrode material 51A. The second electrode material 52 may include carbon, and be a carbon electrode layer. The second electrode material 52 may be formed by using a deposition process such as Physical Vapor Deposition (PVD).

The second electrode material 52 may be formed with a sufficient thickness T to cover the damaged region D. However, the roughness of a surface of the second electrode material 52 may increase as the deposition thickness increases. Increased roughness may cause a change in thickness of layers formed in a subsequent process. In addition, the distribution width of a voltage may increase due to the change in thickness, and therefore, a read margin may be decreased. Accordingly, the thickness of the second electrode material 52 is controlled such that the roughness of the surface of the second electrode material 52 falls within a target range while sufficiently covering the damaged region D. The target range may refer to a range in which an adequate read margin can be secured.

The second electrode material 52 is formed with a thickness that is less than a thickness of the first electrode material 51. The thickness of the second electrode material 52 is controlled to provide a relatively low roughness of the surface of the second electrode material 52. In particular, the thickness T of the second electrode material 52 may be 100 Å or less. When the thickness of the second electrode material 52 is controlled to become 100 Å or less, the roughness of the surface of the second electrode material 52 can be controlled to be 30 Å or less. Within these dimensional parameters, an effective read margin can be secured.

The second electrode material 52 may be electrically connected to the first electrode material 51A, and the first electrode material 51A and the second electrode material 52 may constitute one electrode layer EL. The electrode layer EL may correspond to the first electrode 11, the second electrode 13, or the third electrode 15, which are described with reference to FIGS. 2B and 2C. Alternatively, the electrode layer EL may correspond to the first electrode 31A or 31B, the second electrode 33A or 33B, or the third electrode 35A or 35B, which are described with reference to FIGS. 4A and 4B.

A series of processes for forming the electrode layer EL may be performed in-situ in the same apparatus. A process of forming the first electrode material 51, a process of surface-treating the first electrode material 51, and a process of forming the second electrode material 52 may be performed in-situ in a PVD apparatus.

According to the manufacturing method described above, the second electrode material 52 having a thickness that is less than a thickness of the first electrode material 51A is formed on the surface-treated first electrode material 51A. Thus, an electrode layer EL having a low resistance and a low roughness can be formed. Further, the memory cells can have a uniform threshold voltage, and peripheral layers can be prevented from being damaged in the manufacturing process.

Figure 6A:
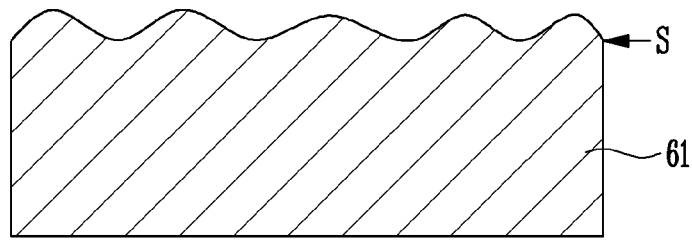
FIGS. 6A, 6B and 6C are cross-sectional views illustrating a method for manufacturing an electronic device in accordance with an embodiment of the present disclosure.
Figure 6B:
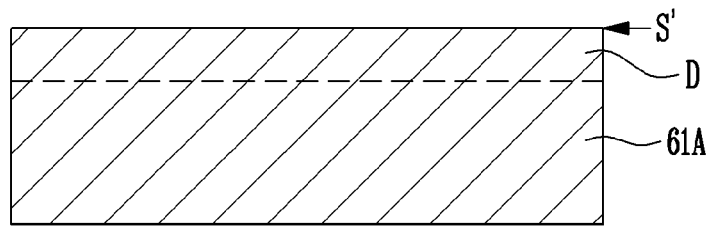
Figure 6C:
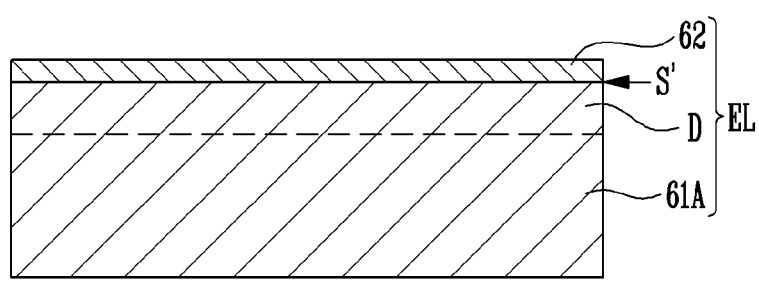

FIGS. 6A to 6C are sectional views illustrating a method for manufacturing an electronic device in accordance with an embodiment of the present disclosure. In the following description, elements that are redundant to the disclosure above may be omitted.

Referring to FIG. 6A, a first electrode material 61 is formed. The first electrode material 61 may be used to form one of the first electrode 11, the second electrode 13, and the third electrode 15, which are described with reference to FIGS. 2B and 2C. Alternatively, the first electrode material 61 may be used to form the first electrode 31A or 31B, the second electrode 33A or 33B, or the third electrode 35A or 35B, which are described with reference to FIGS. 4A and 4B.

The first electrode material 61 may include a conductive material such as metal or metal nitride. The first electrode material 61 may include one or more of tungsten (W), tungsten nitride (WN), tungsten silicide (WSi), titanium (Ti), titanium nitride ($TiN_x$), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), carbon nitride ($CN_x$) silicon carbide (SiC), silicon carbon nitride (SiCN), copper (Cu), zinc (Zn), nickel (Ni), cobalt (Co), lead (Pb), platinum (Pt), etc. The first electrode material 61 may be formed by using a deposition process such as Physical Vapor Deposition (PVD). A surface S of the first electrode material 61 may be uneven, or characterized by a surface roughness.

Referring to FIG. 6B, the first electrode material 61 is surface-treated. The roughness of the first electrode material 61 can be decreased through a surface treatment process. The surface treatment process may be performed in-situ when the first electrode material 61 is formed, or be performed after the first electrode material 61 is formed. The surface treatment process may be an etching process, an ion injection process, a doping process, etc. A surface-treated first electrode material 61A may include a damaged region D.

Referring to FIG. 6C, a second electrode material 62 is formed on a surface S' of the first electrode material 61A. The second electrode material 62 may be used to form the first electrode 11, the second electrode 13, or the third electrode 15, which are described with reference to FIGS. 2B and 2C. Alternatively, the second electrode material 62 may be used to form the first electrode 31A or 31B, the second electrode 33A or 33B, or the third electrode 35A or 35B, which are described with reference to FIGS. 4A and 4B.

The second conductive material 62 may include a conductive material such as metal or metal nitride. The second electrode material 62 may include one or more of tungsten (W), tungsten nitride (WN), tungsten silicide (WSi), titanium (Ti), titanium nitride ($TiN_x$), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), carbon nitride ($CN_x$) silicon carbide (SiC), silicon carbon nitride (SiCN), copper (Cu), zinc (Zn), nickel (Ni), cobalt (Co), lead (Pb), platinum (Pt), etc. The second electrode material 62 may be formed by using a deposition process such as Physical Vapor Deposition (PVD).

The second electrode material 62 is formed to cover the damaged region D. The second electrode material 62 may have a thickness that is less than a thickness of the first electrode material 61A. The thickness T of the second electrode material 62 may be 100 Å or less. In addition, the surface roughness of the second electrode material 62 may be 30 Å or less.

Accordingly, an electrode layer EL is formed, which includes the surface-treated first electrode material 61A and the second electrode material 62 having a low thickness. A property of the electrode layer EL, such as resistance or roughness, may be may result from a property of the surface-treated first electrode material 61A and a property of the second electrode material 62. The surface-treated first electrode material 61A and the second electrode material 62 may have substantially the same or different properties.

A property of the surface-treated first electrode material 61A may relate to a property of the first electrode material 61, a condition of the surface-treatment process, etc. The first electrode material 61 and the second electrode material 62 may have substantially the same or different properties. In addition, the process for forming the first electrode material 61 and the process for forming the second electrode material 62 may be substantially the same or be different from each other.

In an embodiment, process conditions for forming the first electrode material 61 and process conditions for forming the second electrode material 62 may be substantially the same. A process temperature for forming the first electrode material 61 and a process temperature for forming the second electrode material 62 may be substantially the same, and an impurity concentration of the first electrode material 61 may be substantially the same as an impurity concentration of the second electrode material 62.

In an embodiment, a process condition for forming the first electrode material 61 may be different from a process condition for forming the second electrode material 62. The process condition may be a condition such as temperature or impurity concentration. The first electrode material 61 may be formed at a first temperature, and the second electrode material 62 may be formed at a second temperature different from the first temperature. The first electrode material 61 and the second electrode material 62 may be formed such that the impurity concentration of the first electrode material 61 and the impurity concentration of the second electrode material 62 are different from each other.

The impurity concentration may be controlled when the first electrode material 61 and the second electrode material 62 are deposited. The first electrode material 61 may be formed while doping an impurity at a first concentration, and the second electrode material 62 may be formed while doping the impurity at a second concentration different from the first concentration. In an embodiment, a doping process is performed on the first electrode material 61, and no doping process is performed on the second electrode material 62. In another embodiment, no doping process is performed on the first electrode material 61, and a doping process is performed on the second electrode material 62.

The impurity concentration may be controlled after the first electrode material 61 and the second electrode material 62 are deposited. Impurities may be ion-injected at a first concentration into the first electrode material 61 after the first electrode material 61 is formed, and be ion-injected at a second concentration different from the first concentration into the second electrode material 62 after the second electrode material 62 is formed. In an embodiment, an ion injection process may be performed on the first electrode material 61, and no ion injection process is performed on the second electrode material 62. In another embodiment, no ion injection process on the first electrode material 61, and an ion injection process is performed on the second electrode material 62.

The first temperature may be set lower than the second temperature, or the first electrode material 61 or 61A may have an impurity concentration higher than that of the second electrode material 62. The first electrode material 61 or 61A may have a higher resistance than a resistance of the second electrode material 62. In another embodiment, the first temperature may be set higher than the second temperature, or the first electrode material 61 or 61A may have an impurity concentration lower than that of the second electrode material 62. Accordingly, the first electrode material 61 or 61A may have a resistance that is lower than a resistance of the second electrode material 62.

According to the manufacturing processes described above, properties of the first electrode material 61 and the second electrode material 62 such as surface roughness and resistance can be individually controlled by controlling process conditions. Thus, the properties of the resulting electrode layer EL can be controlled by controlling process conditions of the individual constituent layers.

Figure 7A:
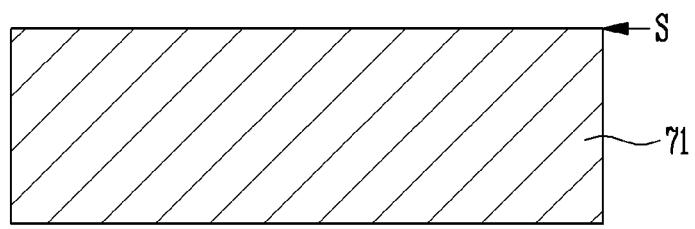
FIGS. 7A and 7B are cross-sectional views illustrating a method for manufacturing an electronic device in accordance with an embodiment of the present disclosure.
Figure 7B:
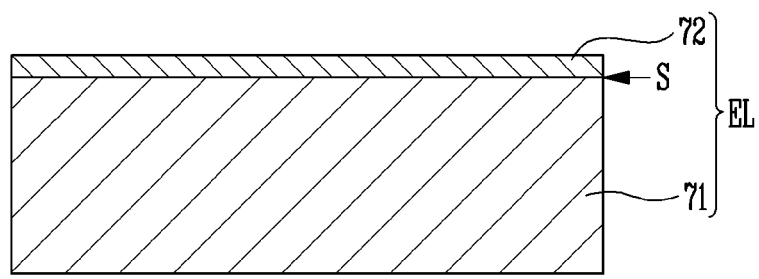

FIGS. 7A and 7B are cross-sectional views illustrating a method for manufacturing an electronic device in accordance with an embodiment of the present disclosure. In the following description, elements that are redundant to the disclosure above may be omitted.

Referring to FIG. 7A, a first electrode material 71 is formed. The first electrode material 71 may include carbon, and be a carbon electrode layer. The first electrode material 71 may be formed by using a deposition process such as Physical Vapor Deposition (PVD). A surface S of the first electrode material 71 may have a degree of surface roughness.

Referring to FIG. 7B, a second electrode material 72 is formed on the surface S of the first electrode material 71. The second electrode material 72 may include carbon, and be a carbon electrode layer. The second electrode material 72 may be formed by using a deposition process such as Physical Vapor Deposition (PVD). The second electrode material 72 has a thickness that is less than a thickness of the first electrode material 71. The thickness of the second electrode material 72 is controlled to be relatively low, so that the surface roughness of the second electrode material 72 can be controlled to be relatively low. In an embodiment, the thickness of the second electrode material 72 is controlled to be 100 Å or less, so that a resulting surface roughness of the second electrode material 72 is 30 Å or less.

Accordingly, an electrode layer EL is formed, which includes the first electrode material 71 and the second electrode material 72 having a relatively low thickness. The final resistance and roughness of the electrode layer EL may result from a property of the first electrode material 71 and a property of the second electrode material 72. The first electrode material 71 and the second electrode material 72 may have substantially the same properties or have different properties. The process for forming the first electrode material 71 and may be substantially the same or be different from the process for forming the second electrode material 72.

According to the manufacturing method described above, the properties of the first electrode material 71 and the second electrode material 72 can be controlled according to process conditions. Furthermore, process conditions for forming the first electrode material 71 may be controlled so that the surface of the first electrode material 71 has a roughness in a target range. Thus, an electrode layer EL having a low roughness can be formed even when a surface-treatment process is omitted.

Figure 8A:
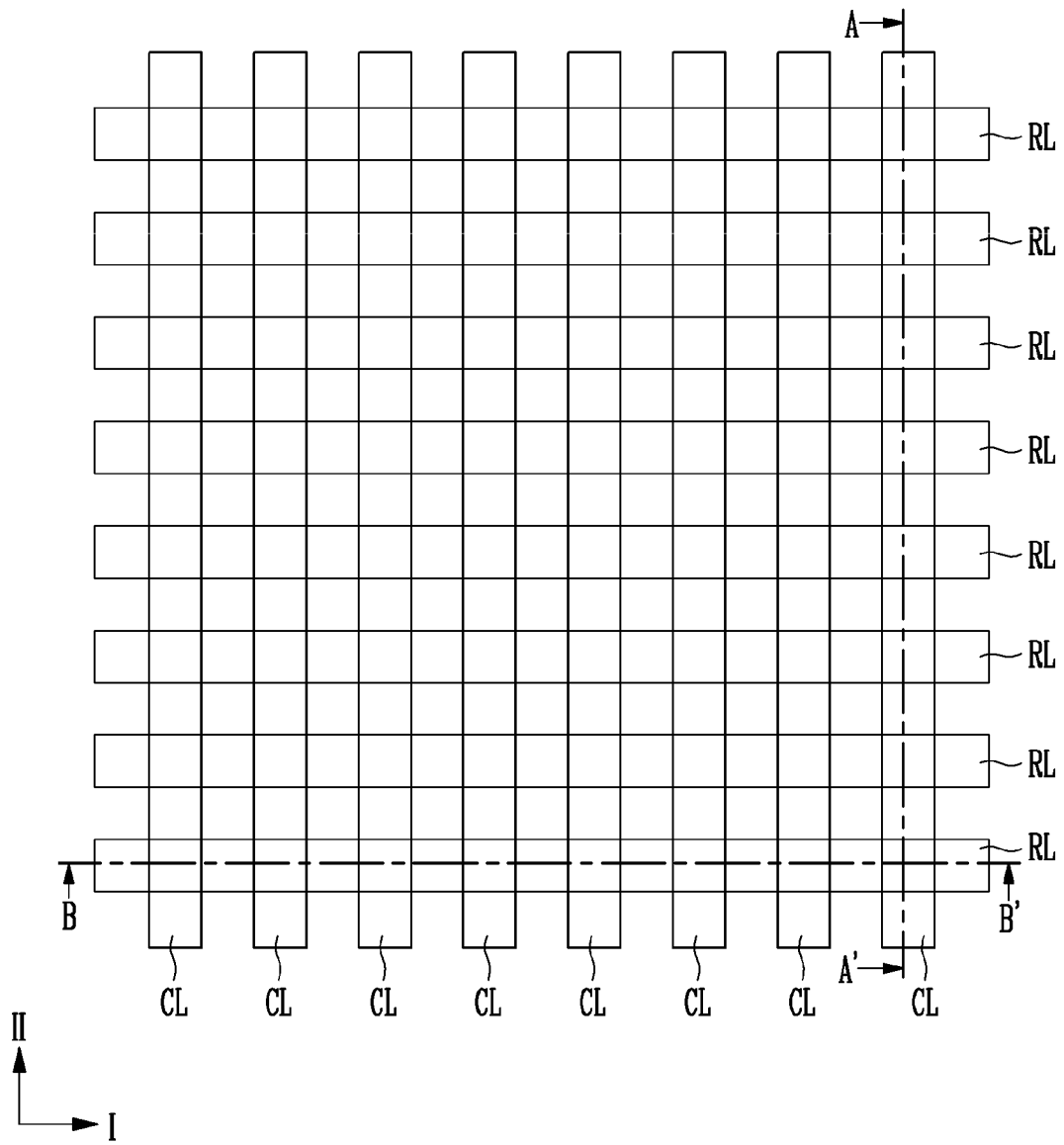
FIGS. 8A, 8B, 8C, 8D and 8E are cross-sectional views illustrating a method for manufacturing an electronic device in accordance with an embodiment of the present disclosure.
Figure 8B:
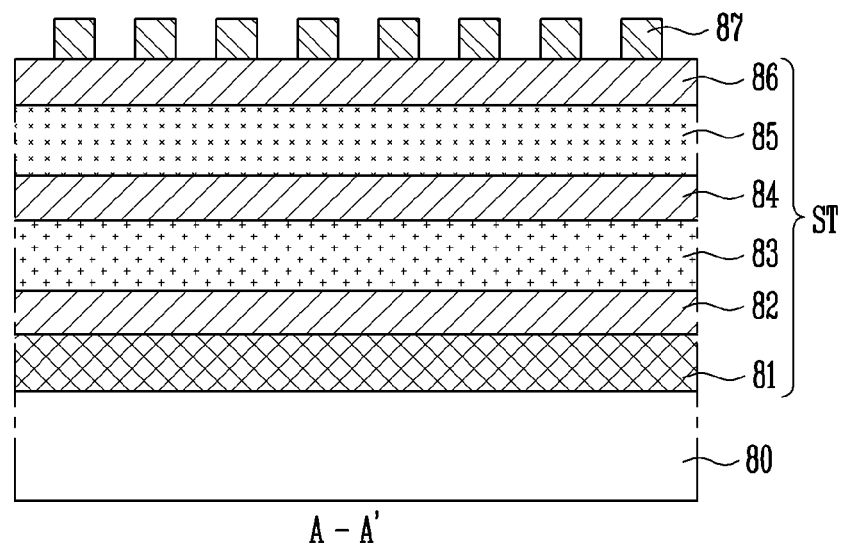
Figure 8C:
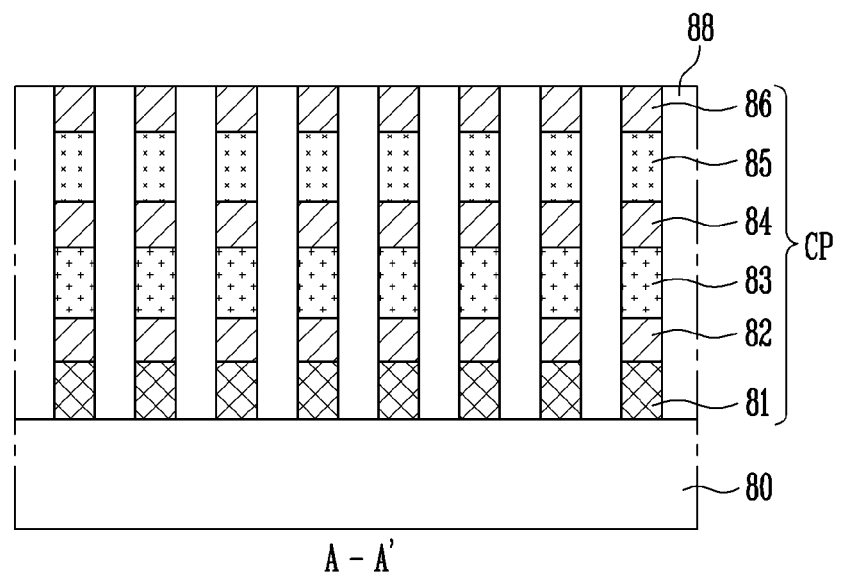
Figure 8D:
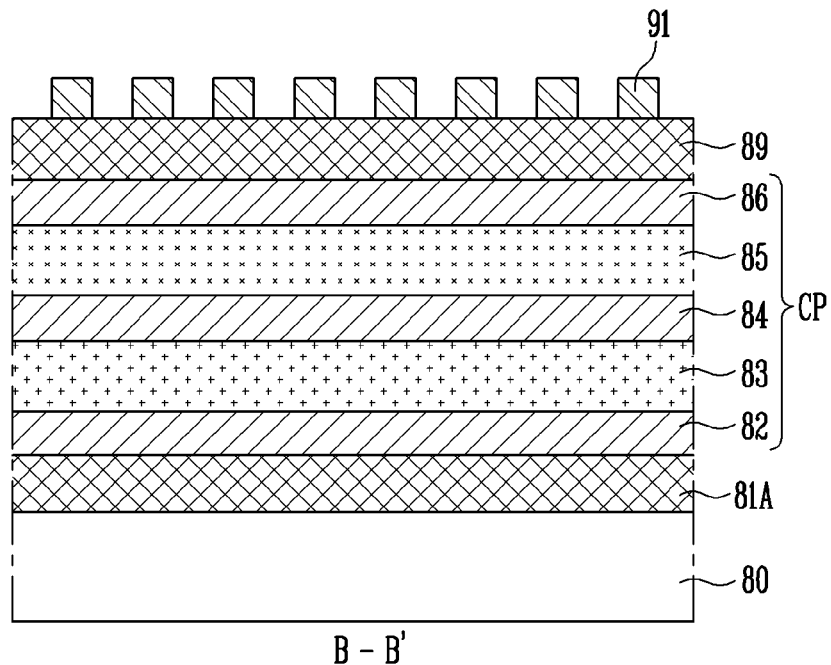
Figure 8E:
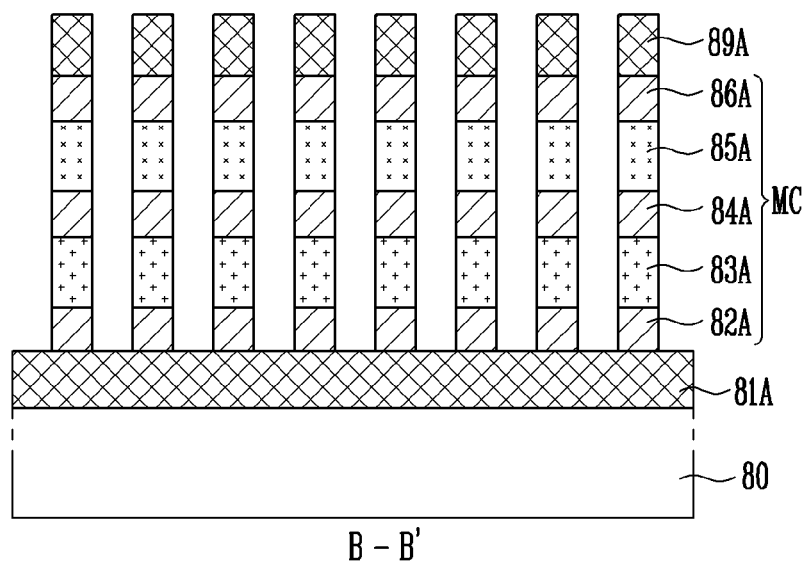

FIGS. 8A to 8E are sectional views illustrating a method for manufacturing an electronic device in accordance with an embodiment of the present disclosure. FIG. 8A is a layout view, FIGS. 8B and 8C are cross-sectional views taken along line A-A' shown in FIG. 8A, and FIGS. 8D and 8E are cross-sectional views taken along line B-B'. In the following description, elements that are redundant to the disclosure above may be omitted.

Referring to FIGS. 8A and 8B, a first conductive material 81 is formed on a base 80. The base 80 may include a semiconductor substrate, and include a lower structure such as a peripheral circuit. The first conductive material 81 may be used to form a row line, and include a metal such as tungsten.

A stack structure ST is formed on the first conductive material 81. The stack structure ST may include at least one of a first electrode layer 82, a switching material 83, a second electrode layer 84, a variable resistance material 85, and a third electrode layer 86. The stacking order of the layers included in the stack structure ST may vary between different embodiments. In addition, the stack structure ST may further include an interface electrode, etc.

At least one of the first electrode layer 82, the second electrode layer 84, and the third electrode layer 86 may be formed by using the manufacturing methods described with respect to FIG. 5A to 5C, 6A to 6C, or 7A and 7B. At least one of the first electrode layer 82, the second electrode layer 84, and the third electrode layer 86 may correspond to the electrode layer EL shown in FIG. 5C, 6C or 7B.

First, the first electrode layer 82 may be formed on the first conductive material 81. The first electrode layer 82 may be electrically connected to the first conductive material 81, and include a material having a low resistance to be used as an electrode. The first electrode layer 82 may have a surface with a low roughness. The first electrode layer 82 may be a carbon electrode layer.

Subsequently, the switching material 83 may be formed on the first electrode layer 82. A threshold voltage of the switching material 83 may vary substantially according to thickness. For example, when the thickness increases by about 10 Å, the threshold voltage may increase by a few hundreds of my. When the first electrode layer 82 has a surface with a high roughness, the threshold voltage may fluctuate according to a high point and a low point of the surface. In a region corresponding to the high point, the switching material 83 may be relatively thin and the threshold voltage of the switching material 83 may be relatively low. In a region corresponding to the low point, the switching material 83 may be thicker and the threshold voltage of the switching material 83 may be relatively high. Therefore, when the surface roughness of first electrode layer 82 is high, the distribution of a threshold voltage may increase, and the margin of a read operation may decrease. On the other hand, in accordance with embodiments of the present disclosure, the switching material 83 is formed on the surface of the first electrode layer 82 which has a lower roughness, so that the switching material 83 can be formed with a uniform thickness. Accordingly, embodiments of the present application may reduce fluctuation of the threshold voltage.

Further, the switching material 83 is formed on the surface having a low roughness, which prevents degradation of a fine structure of an initial thin film of the switching material 83. A void can be prevented from occurring between the first electrode layer 82 and the switching material 83, so that the switching material 83 can be stably adhered to the first electrode layer 82.

Subsequently, the second electrode layer 84 may be formed on the switching material 83. The second electrode layer 84 may include a material having a low resistance to be used as an electrode. The second electrode layer 84 may have a surface having a low roughness. In an embodiment, the second electrode layer 84 may be a carbon electrode layer.

Subsequently, the variable resistance material 85 may be formed on the second electrode layer 84. Like the switching material 83, the threshold voltage of the variable resistance material 85 varies substantially based on thickness. In accordance with embodiments of the present disclosure, the variable resistance material 85 is formed on the surface of the second electrode layer 84 having a low roughness, so that the variable resistance material 85 can be formed with a uniform thickness. Accordingly, fluctuation of the threshold voltage can be reduced.

Further, the variable resistance material 85 is formed on the surface having a low roughness, which prevents degradation of a fine structure of an initial thin film of the variable resistance material 85. A void can be prevented from occurring between the second electrode layer 84 and the variable resistance material 85, and the variable resistance material 85 can be stably adhered to the second electrode layer 84.

Subsequently, the third electrode layer 86 may be formed on the variable resistance material 85. The third electrode layer 86 may include a material having a low resistance. The third electrode layer 86 may have a surface with a low roughness. The third electrode layer 86 may be a carbon electrode layer.

Accordingly, the stack structure ST is formed. Subsequently, a first mask pattern 87 is formed on the stack structure ST. The first mask pattern 87 may have a line shape extending in a first direction I, or have a loop shape. The first mask pattern 87 may be formed using a technique such as Spacer Patterning Technology (SPT).

Referring to FIGS. 8A and 8C, cell patterns CP are formed by etching the stack structure ST, using the first mask pattern 87 as an etch barrier.

First, the third electrode layer 86 is etched by using the first mask pattern 87 as an etch barrier. The shape of the exposed upper surface of the third electrode layer 86 may be transferred downward when the third electrode layer 86 is etched. In accordance with an embodiment of the present disclosure, since the third electrode layer 86 has a surface with a low roughness, the third electrode layer 86 can be etched to a uniform depth. Thus, portions of the variable resistance material 85 can be prevented from being exposed or from being chemically or physically damaged.

Subsequently, after the variable resistance material 85 is etched, the second electrode layer 84 is etched. In accordance with an embodiment of the present disclosure, since the second electrode layer 84 has a surface with a low roughness, the second electrode layer 84 can be etched to a uniform depth. Thus, portions of the switching material 83 can be prevented from being exposed or from being chemically or physically damaged.

Subsequently, after the switching material 83 is etched, the first electrode layer 82 is etched. Accordingly, the cell patterns CP are formed. Subsequently, row lines 81A are formed by etching the first conductive material 81. Subsequently, an insulating layer 88 is formed. The insulating layer 88 may fill a space between adjacent cell patterns CP and between adjacent row line 81A.

Referring to FIGS. 8A and 8D, a second conductive material 89 is formed. The second conductive material 89 may be formed on the cell patterns CP and the insulating layer 88. The second conductive material 89 is used to form column lines, and may include a metal such as tungsten.

Subsequently, a second mask pattern 91 is formed on the second conductive material 89. The second mask pattern 91 may be formed to intersect the cell patterns CP. The second mask pattern 91 may have a line shape extending in a second direction II, or have a loop shape. The second mask pattern 91 may be formed using a technique such as a Spacer Patterning Technology (SPT) process.

Referring to FIGS. 8A and 8E, column lines 89A and memory cells MC are formed. First, the column lines 89A are formed by etching the second conductive material 89, using the second mask pattern 91 as an etch barrier. Subsequently, the memory cells MC are formed by etching the cell patterns CP. The first to third electrode materials 82, 84, and 86 may have a surface with a low roughness, and prevent the variable resistance material 85, the switching material 83, etc. from being damaged in the etching process.

The memory cells MC may be located in regions in which the column lines 89A and the row lines 81A intersect each other. Each of the memory cells MC may include at least one of a first electrode 82A, a switching layer 83A, a second electrode 84A, a variable resistance layer 85A, and a third electrode 86A.

At least one of the first electrode 82A, the second electrode 84A, and the third electrode 86A may be an electrode which has a surface with a low roughness and a low resistance, and be a carbon electrode. The first electrode 82A may form an ohmic contact with the switching layer 83A. The second electrode 84A may form an ohmic contact with the switching layer 83A and the variable resistance layer 85A. The third electrode 86A may form an ohmic contact with the variable resistance layer 85A.

The first electrode 82A may prevent or minimize a material of the switching layer 83A from migrating to peripheral layers such as the row line 81A. The second electrode 84A may prevent or minimize a material of the switching layer 83A and a material of the variable resistance layer 85A from migrating to each other. The third electrode 86A may prevent or minimize a material of the variable resistance layer 85A from migrating to peripheral layers such as the column line 89A.

The first electrode 82A may have a low chemical reactivity with respect to the switching layer 83A. The second electrode 84A may have a low chemical reactivity with respect to the switching layer 83A or the variable resistance layer 85A. The third electrode 86A may have a low chemical reactivity with respect to the variable resistance layer 85A.

According to the manufacturing method described above, the memory cells MC include an electrode which has a low resistance and a low roughness. Thus, the memory cells MC can have a uniform characteristic. Further, the variable resistance layer 85A, the switching layer 83A, etc. can be prevented from being damaged in a manufacturing process.

Figure 9:
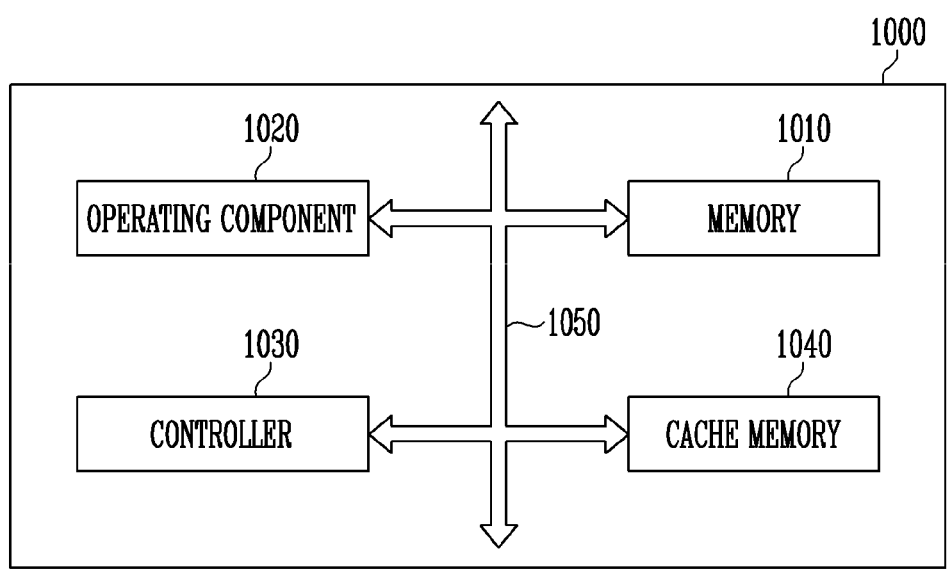
FIG. 9 is a configuration view of a microprocessor implementing a memory device in accordance with an embodiment of the present disclosure.

FIG. 9 is a configuration view of a microprocessor implementing a memory device in accordance with an embodiment of the present disclosure.

Referring to FIG. 9, the microprocessor 1000 may perform tasks for controlling and tuning a series of processes of receiving data from various external devices, processing the data, and outputting processing results to external devices. The microprocessor 1000 may include a memory 1010, an operating component 1020, a controller 1030, and the like. The microprocessor 1000 may be various data processing units such as a central processing unit (CPU), a graphic processing unit (GPU), a digital signal processor (DSP), and an application processor (AP).

The memory 1010 is a part which stores data in the microprocessor 1000, as a processor register, register or the like. The memory 1010 may include a data register, an address register, a floating point register, and the like. Besides, the memory 1010 may include various registers. The memory 1010 may perform the function of temporarily storing data for which operations are to be performed by the operating component 1020, result data of performing the operations and addresses where data for performing of the operations are stored.

The memory 1010 may include one or more of the above-described electronic devices in accordance with the embodiments. For example, the memory 1010 may include: a row line; a column line intersecting the row line; and a memory cell located between the row line and the column line, the memory cell including a first carbon electrode material and a second carbon electrode material which is formed on a surface of the first carbon electrode material and has a thickness of 100 Å or less. Accordingly, read operation characteristics of the memory 1010 can be improved. Consequently, read operation characteristics of the microprocessor 1000 can be improved.

The operating component 1020 may perform several arithmetical operations or logical operations according to results that the controller 1030 decodes commands. The operating component 1020 may include at least one arithmetic logic unit (ALU) and the like.

The controller 1030 may receive signals from the memory 1010, the operating component 1020 and an external device of the microprocessor 1000, perform extraction, decoding of commands, and controlling input and output of signals of the microprocessor 1000, and execute processing represented by programs.

The microprocessor 1000 in accordance with this embodiment may additionally include a cache memory 1040 which can temporarily store data to be inputted from an external device other than the memory 1010 or to be outputted to an external device. The cache memory 1040 may exchange data with the memory 1010, the operating component 1020 and the controller 1030 through a bus interface 1050.

Figure 10:
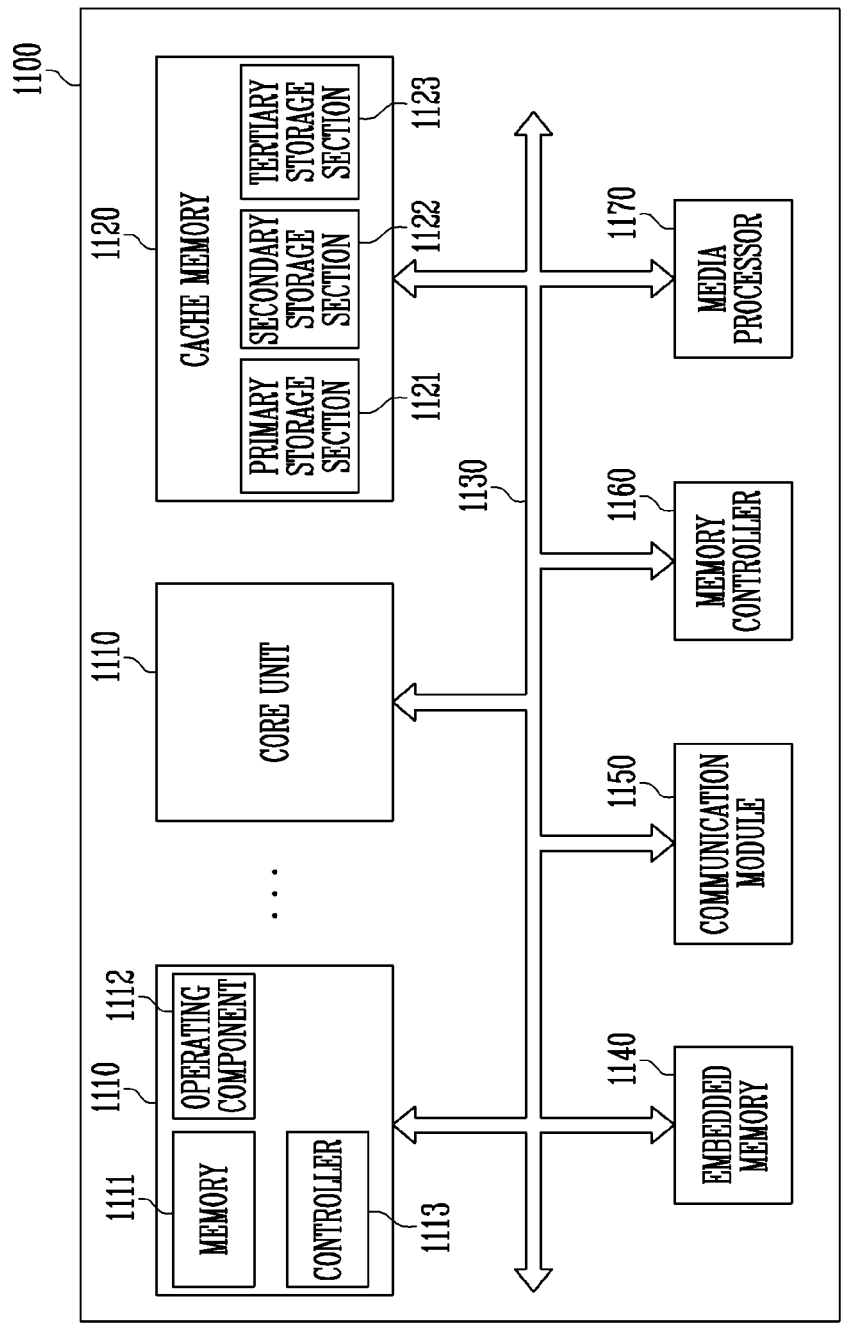
FIG. 10 is a configuration view of a processor implementing a memory device in accordance with an embodiment of the present disclosure.

FIG. 10 is a configuration view of a processor implementing a memory device in accordance with an embodiment of the present disclosure.

Referring to FIG. 10, the processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory 1120 which serves to storing data temporarily, and a bus interface 1130 for transferring data between internal and external devices. The processor 1100 may include various system-on-chips (SoCs) such as a multi-core processor, a graphic processing unit (GPU), and an application processor (AP).

The core unit 1110 of this embodiment is a part which performs arithmetic logic operations for data inputted from an external device, and may include a memory 1111, an operating component 1112 and a controller 1113.

The memory 1111 is a part which stores data in the processor 1100, as a processor register, a register or the like. The memory 1111 may include a data register, an address register, a floating point register, and the like. Besides, the memory 1111 may include various registers. The memory 1111 may perform the function of temporarily storing data for which operations are to be performed by the operating component 1112, result data of performing the operations and addresses where data for performing of the operations are stored. The operating component 1112 is a part which performs operations in the processor 1100. The operating component 1112 may perform several arithmetical operations, logical operations, according to results that the controller 1113 decodes commands, or the like. The operating component 1112 may include at least one arithmetic logic unit (ALU) and the like. The controller 1113 may receive signals from the memory 1111, the operating component 1112 and an external device of the processor 1100, perform extraction, decoding of commands, controlling input and output of signals of processor 1100, and execute processing represented by programs.

The cache memory 1120 is a part which temporarily stores data to compensate for a difference in data processing speed between the core unit 1110 operating at a high speed and an external device operating at a low speed. The cache memory 1120 may include a primary storage section 1121, a secondary storage section 1122 and a tertiary storage section 1123. In general, the cache memory 1120 includes the primary and secondary storage sections 1121 and 1122, and may include the tertiary storage section 1123 in the case where high storage capacity is required. As the occasion demands, the cache memory 1120 may include an increased number of storage sections. That is, the number of storage sections which are included in the cache memory 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory 1120 may include one or more of the above-described electronic devices in accordance with the embodiments. For example, the cache memory 1120 may include: a row line; a column line intersecting the row line; and a memory cell located between the row line and the column line, the memory cell including a first carbon electrode material and a second carbon electrode material which is formed on a surface of the first carbon electrode material and has a thickness of 100 Å or less. Accordingly, read operation characteristics of the cache memory 1120 can be improved. Consequently, read operation characteristics of the processor 1100 can be improved.

Although a case where all the primary, secondary and tertiary storage sections 1121, 1122 and 1123 are configured inside the cache memory 1120 is illustrated in FIG. 10, all the primary, secondary and tertiary storage sections 1121, 1122 and 1123 of the cache memory 1120 may be configured outside the core unit 1110 and may compensate for a difference in data processing speed between the core unit 1110 and the external device. Alternatively, the primary storage section 1121 of the cache memory 1120 may be disposed inside the core unit 1110 and the secondary storage section 1122 and the tertiary storage section 1123 may be configured outside the core unit 1110 to strengthen the function of compensating for a difference in data processing speed. Alternatively, the primary and secondary storage sections 1121, 1122 may be disposed inside the core unit 1110 and tertiary storage sections 1123 may be disposed outside the core unit 1110.

The bus interface 1130 is a part which connects the core unit 1110, the cache memory 1120 and external device and allows data to be efficiently transmitted.

The processor 1100 in accordance with this embodiment may include a plurality of core units 1110, and the plurality of core units 1110 may share the cache memory 1120. The plurality of core units 1110 and the cache memory 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another embodiment, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 in accordance with this embodiment may further include an embedded memory 140 which stores data, a communication module 1150 which can transmit and receive data to and from an external device in a wired or wireless manner, a memory controller 1160 which drives an external memory device, and a media processor 1170 which processes the data processed in the processor 1100 or the data inputted from an external input device and outputs the processed data to an external interface device, and the like. Besides, the processor 1100 may include a plurality of various modules and devices. The plurality of modules which are added may exchange data with the core units 1110 and the cache memory 1120 and with one another, through the bus interface 1130.

The embedded memory 1140 may include not only a volatile memory but also a nonvolatile memory. The volatile memory may include a DRAM (dynamic random access memory), a mobile DRAM, an SRAM (static random access memory), and a memory with similar functions to above mentioned memories, and the like. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and the like. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radfrequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and the like.

The memory controller 1160 is to administrate and process data transmitted between the processor 1100 and an external storage device operating according to a different communication standard. The memory controller 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The media processor 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition auddevice (HD audio), a high definition multimedia interface (HDMI) controller, and the like.

Figure 11:
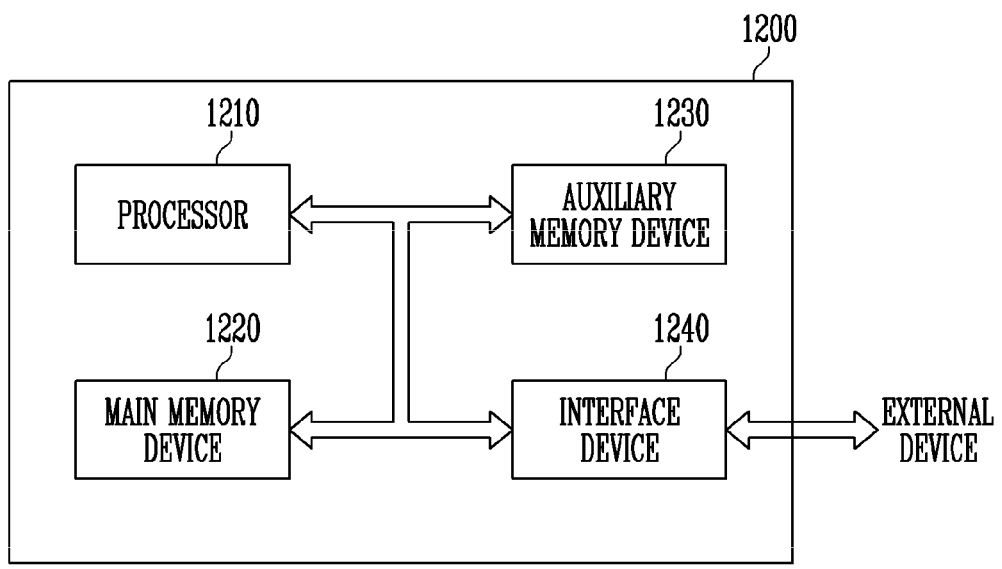
FIG. 11 is a configuration view of a system implementing a memory device in accordance with an embodiment of the present disclosure.

FIG. 11 is a configuration view of a system implementing a memory device in accordance with an embodiment of the present disclosure.

Referring to FIG. 11, the system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and the like. The system 1200 of this embodiment may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audvisual (AV) system, a smart television, and the like.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and the like.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described electronic devices in accordance with the embodiments. For example, the main memory device 1220 may include: a row line; a column line intersecting the row line; and a memory cell located between the row line and the column line, the memory cell including a first carbon electrode material and a second carbon electrode material which is formed on a surface of the first carbon electrode material and has a thickness of 100 Å or less. Accordingly, read operation characteristics of the main memory device 1220 can be improved. Consequently, read operation characteristics of the system 1200 can be improved.

Also, the main memory device 1220 may further include a static random access memory (SRAM), a dynamic random access memory (DRAM), and the like, of a volatile memory type in which all contents are erased when power supply is cut off. Unlike this, the main memory device 1220 may not include the semiconductor devices in accordance with the embodiments, but may include a static random access memory (SRAM), a dynamic random access memory (DRAM), and the like, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device

1230 may include one or more of the above-described electronic devices in accordance with the embodiments. For example, the auxiliary memory device 1230 may include: a row line; a column line intersecting the row line; and a memory cell located between the row line and the column line, the memory cell including a first carbon electrode material and a second carbon electrode material which is formed on a surface of the first carbon electrode material and has a thickness of 100 Å or less. Accordingly, read operation characteristics of the auxiliary memory device 1230 can be improved. Consequently, read operation characteristics of the system 1200 can be improved.

Also, the auxiliary memory device 1230 may further include a data storage system (see 1300 of FIG. 12) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like. Unlike this, the auxiliary memory device 1230 may not include the semiconductor devices in accordance with the embodiments, but may include data storage systems (see 1300 of FIG. 12) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The interface device 1240 may be to perform exchange of commands and data between the system 1200 of this embodiment and an external device. The interface device 1240 may be a keypad, a keyboard, a mouse, a speaker, a mike, a display, various human interface devices (HIDs), a communication device, and the like. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and the like. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radfrequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and the like.

Figure 12:
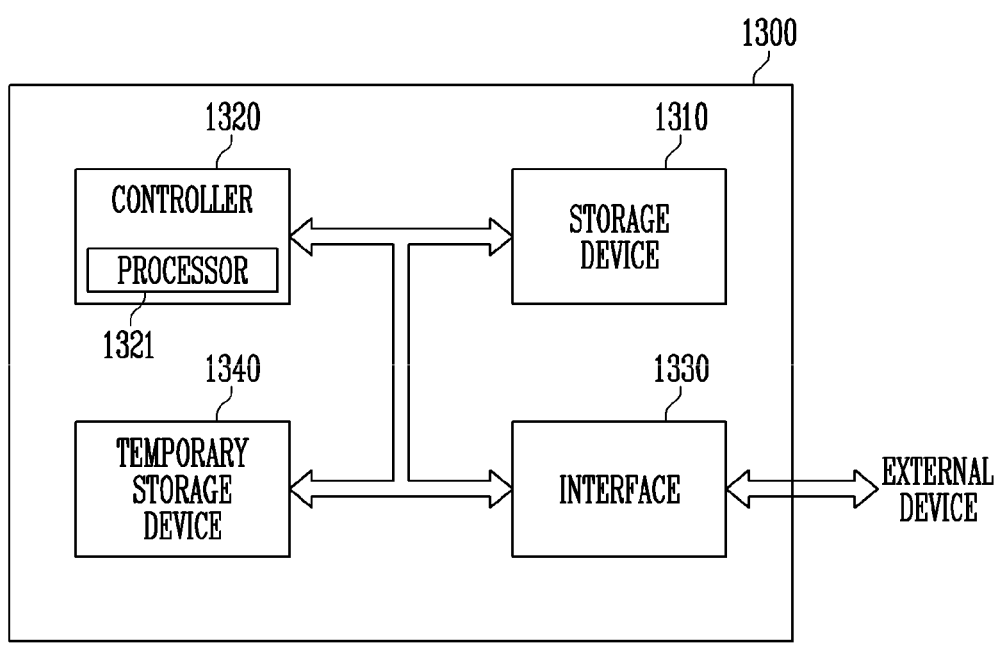
FIG. 12 is a configuration view of a data storage system implementing a memory device in accordance with an embodiment of the present disclosure.

FIG. 12 is a configuration view of a data storage system implementing a memory device in accordance with an embodiment of the present disclosure.

Referring to FIG. 12, the data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and the like, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and the like.

The controller 1320 may control exchange of data between the storage device 1310 and the interface 1330. To this end, the controller 1320 may include a processor 1321 for performing an operation for, processing commands inputted through the interface 1330 from an outside of the data storage system 1300, and the like.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and the like, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described electronic devices in accordance with the embodiments. For example, the temporary storage device 1340 may include a row line; a column line intersecting the row line; and a memory cell located between the row line and the column line, the memory cell including a first carbon electrode material and a second carbon electrode material which is formed on a surface of the first carbon electrode material and has a thickness of 100 Å or less. Accordingly, read operation characteristics of the temporary storage device 1340 can be improved. Consequently, read operation characteristics of the data storage system 1300 can be improved.

Figure 13:
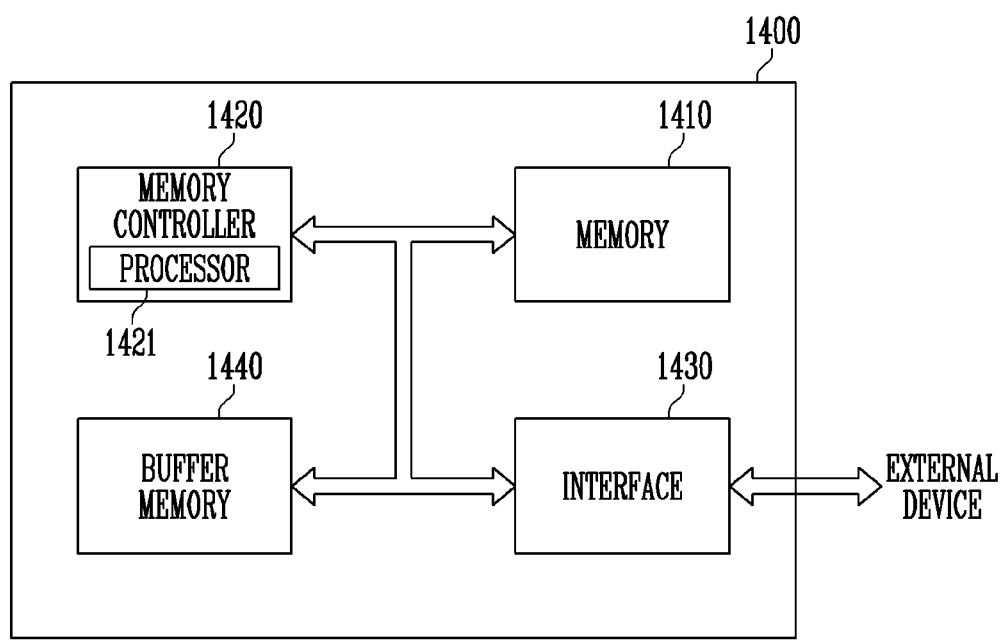
FIG. 13 is a configuration view of a memory system implementing a memory device in accordance with an embodiment of the present disclosure.

FIG. 13 is a configuration view of a memory system implementing a memory device in accordance with an embodiment of the present disclosure.

Referring to FIG. 13, the memory system 1400 may include a memory 1410 which has a nonvolatile characteristic as a component for storing data, a memory controller 1420 which controls the memory 1410, an interface 1430 for connection with an external device, and the like. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The memory 1410 for storing data may include one or more of the above-described electronic devices in accordance with the embodiments. For example, the memory 1410 may include: a row line; a column line intersecting the row line; and a memory cell located between the row line and the column line, the memory cell including a first carbon electrode material and a second carbon electrode material which is formed on a surface of the first carbon electrode material and has a thickness of 100 Å or less. Accordingly, read operation characteristics of the memory 1410 can be improved. Consequently, read operation characteristics of the memory system 1400 can be improved.

Also, the memory 1410 of this embodiment may further include a ROM (read only memory), a NOR flash memory, a NAND flash memory, a phase change random access memory (PRAM), a resistive random access memory (RRAM), a magnetic random access memory (MRAM), and the like, which have a nonvolatile characteristic.

The memory controller 1420 may control exchange of data between the memory 1410 and the interface 1430. To this end, the memory controller 1420 may include a processor 1421 for performing an operation for processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like, or be compatible with interfaces which are used in devices similar to the above mentioned devices. The interface 1430 may be compatible with one or more interfaces having a different type from each other.

The memory system 1400 of this embodiment may further include a buffer memory 1440 for efficiently transferring data between the interface 1430 and the memory 1410 according to diversification and high performance of an interface with an external device, a memory controller and a memory system. The buffer memory 1440 for temporarily storing data may include one or more of the above-described electronic devices in accordance with the embodiments. For example, the buffer memory 1440 may include a row line, a column line intersecting the row line, and a memory cell located between the row line and the column line, the memory cell including a first carbon electrode material and a second carbon electrode material which is formed on a surface of the first carbon electrode material and has a thickness of 100 Å or less. Accordingly, read operation characteristics of the buffer memory 1440 can be improved. Consequently, read operation characteristics of the memory system 1400 can be improved.

Moreover, the buffer memory 1440 of this embodiment may further include an SRAM (static random access memory), a DRAM (dynamic random access memory), and the like, which have a volatile characteristic, and a phase change random access memory (PRAM), a resistive random access memory (RRAM), a spin transfer torque random access memory (STTRAM), a magnetic random access memory (MRAM), and the like, which have a nonvolatile characteristic. Unlike this, the buffer memory 1440 may not include the semiconductor devices in accordance with the embodiments, but may include an SRAM (static random access memory), a DRAM (dynamic random access memory), and the like, which have a volatile characteristic, and a phase change random access memory (PRAM), a resistive random access memory (RRAM), a spin transfer torque random access memory (STTRAM), a magnetic random access memory (MRAM), and the like, which have a nonvolatile characteristic.

In accordance with the present disclosure, the operational characteristics and reliability of the memory cell can be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method for manufacturing an electronic device including a semiconductor memory, the method comprising:
   forming a first carbon electrode material;
   surface-treating the first carbon electrode material to decrease a surface roughness of the first carbon electrode material; and
   forming a second carbon electrode material on a surface of the surface-treated first carbon electrode material, wherein the second carbon electrode material has a thickness that is less than a thickness of the first carbon electrode material.

2. The method of claim 1, wherein surface-treating the first carbon electrode material includes performing an etching process, an ion injection process, or a doping process.

3. The method of claim 1, wherein the thickness of the second carbon electrode material is 100 Å or less.

4. The method of claim 1, wherein the second carbon electrode material has a surface roughness of 30 Å or less.

5. The method of claim 1, wherein the first carbon electrode material and the second carbon electrode material have substantially the same resistivity.

6. The method of claim 1, wherein the first carbon electrode material and the second carbon electrode material have different resistivities.

7. The method of claim 1, wherein the first carbon electrode material is formed at a first temperature, and the second carbon electrode material is formed at a second temperature different from the first temperature.

8. The method of claim 1, wherein the surface-treated first carbon electrode material and the second carbon electrode material have different impurity concentrations.

9. The method of claim 1, wherein forming the first carbon electrode material, surface-treating the first carbon electrode material, and forming of second carbon electrode material are performed in-situ.

10. A method for manufacturing an electronic device including a semiconductor memory, the method comprising:
forming a first carbon electrode material under first process conditions; and
forming a second carbon electrode material on a surface of the first carbon electrode material under second process conditions different from the first process conditions, wherein a thickness of the second carbon electrode material is less than a thickness of the first carbon electrode material.

11. The method of claim 10, wherein the first carbon electrode material is formed at a first temperature, and the second carbon electrode material is formed at a second temperature different from the first temperature.

12. The method of claim 10, wherein the first carbon electrode material includes an impurity of a first concentration, and the second carbon electrode material includes an impurity of a second concentration different from the first concentration.

13. The method of claim 10, wherein the second carbon electrode material has a thickness of 100 Å or less.

14. The method of claim 10, wherein the second carbon electrode material has a surface roughness of 30 Å or less.

15. The method of claim 10, wherein the first carbon electrode material and the second carbon electrode material have different resistivities.

16. The method of claim 10, further comprising surface-treating the first carbon electrode material before the second carbon electrode material is formed.

* * * * *